(12) United States Patent
Holland et al.

(10) Patent No.: US 12,674,462 B2
(45) Date of Patent: Jul. 7, 2026

(54) FAN SPEED ADJUSTMENT BASED ON DETECTION OF TYPE OF CONNECTED CABLE

(71) Applicant: Lenovo Enterprise Solutions (Singapore) Pte. Ltd., New Tech Park (SG)

(72) Inventors: Jeffrey S. Holland, Newton, NC (US); Bejoy J. Kochuparambil, Apex, NC (US); Lake Maxwell, Cary, NC (US); Tinashe Kucherera, Raleigh, NC (US); Connor Raines, Monroe, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 244 days.

(21) Appl. No.: 18/659,674

(22) Filed: May 9, 2024

(65) Prior Publication Data

US 2025/0347286 A1 Nov. 13, 2025

(51) Int. Cl.
| | |
|---|---|
| *H05K 7/20* | (2006.01) |
| *F04D 25/06* | (2006.01) |
| *F04D 27/00* | (2006.01) |

(52) U.S. Cl.
CPC ........... *F04D 27/004* (2013.01); *F04D 25/06* (2013.01); *H05K 7/20727* (2013.01); *H05K 7/20836* (2013.01)

(58) Field of Classification Search
CPC ...................... H05K 7/20727; H05K 7/20836
See application file for complete search history.

(56) References Cited

U.S. PATENT DOCUMENTS

2019/0247050 A1\* 8/2019 Goldsmith ............... A61F 2/82

OTHER PUBLICATIONS

"IBM High IOPS Modular Adapters configuration information and requirements", Lenovo Support, published Jan. 7, 2016, downloaded on Feb. 27, 2024, pp. 1-5.

\* cited by examiner

*Primary Examiner* — Muhammad S Islam
(74) *Attorney, Agent, or Firm* — Kunzler Needham & Hilton; Bruce R. Needham

(57) ABSTRACT

A method for adjusting fan speed based on a cable connection includes reading an identifier ("ID") of a network interface card ("NIC") installed in a computing device, the identifier indicating a NIC type, determining one or more cable types connectable to the NIC from the specification information of the NIC, and measuring power consumption of the NIC. The method includes determining from the power consumption the one or more cable types connectable to the NIC a current cable type connected to the NIC or a lack of a cable connected to the NIC, determining power requirements for the NIC based on the lack of a cable connected to the NIC or the current cable type connected to the NIC, and adjusting a fan speed of one or more fans of the computing device in response to determining the power requirements for the NIC.

20 Claims, 6 Drawing Sheets

200

| NIC TYPE | No Cable | Passive Cable | Active Cable |
|----------|----------|---------------|--------------|
| A | 5 W | 8 W | 13 W |
| B | 10 W | 15 W | 20 W |
| C | 7 W | 10 W | 15 W |
| D | 3 W | 7 W | 10 W |

| NIC TYPE | Temperature | No Cable | Passive Cable | Active Cable |
|----------|-------------|----------|---------------|--------------|
| A | < 27 C | 5 W | 8 W | 13 W |
| A | ≥ 27C | 6 W | 9 W | 15 W |
| B | < 27 C | 10 W | 15 W | 20 W |
| B | ≥ 27C | 12 W | 17 W | 23 W |
| C | < 27 C | 7 W | 10 W | 15 W |
| C | ≥ 27C | 9 W | 12 W | 17 W |
| D | < 27 C | 3 W | 7 W | 10 W |
| D | ≥ 27C | 4 W | 8 W | 11 W |

FAN SPEED ADJUSTMENT BASED ON DETECTION OF TYPE OF CONNECTED CABLE

FIELD

The subject matter disclosed herein relates to fan speed of a computing device and more particularly relates to adjusting fan speed of a computing device based on type of connected cable.

BACKGROUND

The power consumption of active transceivers used in server networking has steadily increased over time. Cooling these high-power transceivers is becoming non-trivial. The cooling of the transceivers is forcing server fan speeds to be artificially raised and consistently set for the highest setting regardless of the type of cables connected. Management controllers are unable to detect the type of cables installed and the necessary fan speeds to cool the cables. Without the ability to detect whether a cable is active or passive, thermal engineers are forced to assume all cables are active leading to excessive cooling and higher fan speeds when not necessary or required.

BRIEF SUMMARY

A method for adjusting fan speed based on a cable connection is disclosed. An apparatus and computer program product also perform the functions of the method. The method includes reading an identifier ("ID") of a network interface card ("NIC") installed in a computing device, the identifier indicating a NIC type, determining one or more cable types connectable to the NIC from the specification information of the NIC, and measuring power consumption of the NIC. The method includes determining from the power consumption the one or more cable types connectable to the NIC a current cable type connected to the NIC or a lack of a cable connected to the NIC, determining power requirements for the NIC based on the lack of a cable connected to the NIC or the current cable type connected to the NIC, and adjusting a fan speed of one or more fans of the computing device in response to determining the power requirements for the NIC.

An apparatus for adjusting fan speed of a computing device based on connected cables includes a processor and non-transitory computer readable storage media storing code. The code is executable by the processor to perform operations that include reading an ID of a NIC installed in a computing device, where the ID indicates a NIC type, determining, based on the ID of the NIC, one or more cable types connectable to the NIC from specification information for the type of NIC and measuring power consumption of the NIC. The operations include determining from the power consumption of the NIC and the one or more cable types connectable to the NIC a current cable type connected to the NIC or a lack of a cable connected to the NIC. The operations include determining power requirements for the NIC based on the lack of a cable connected to the NIC or the current cable connect to the NIC and adjusting a fan speed of one or more fans of the computing device in response to determining the power requirements for the NIC.

A program product for adjusting fan speed of a computing device based on connected cables includes a non-transitory computer readable storage medium storing code. The code is configured to be executable by a processor to perform operations. The operations include reading an ID of a NIC installed in a computing device, where the ID indicates a NIC type, determining, based on the ID of the NIC, one or more cable types connectable to the NIC from specification information for the type of NIC, and measuring power consumption of the NIC. The operations include determining from the power consumption of the NIC and the one or more cable types connectable to the NIC a current cable type connected to the NIC or a lack of a cable connected to the NCI. The operations include determining power requirements for the NIC based on the lack of a cable connected to the NIC or the current cable type connected to the NCI and adjusting a fan speed of one or more fans of a computing device in response to determining the power requirements for the NIC.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
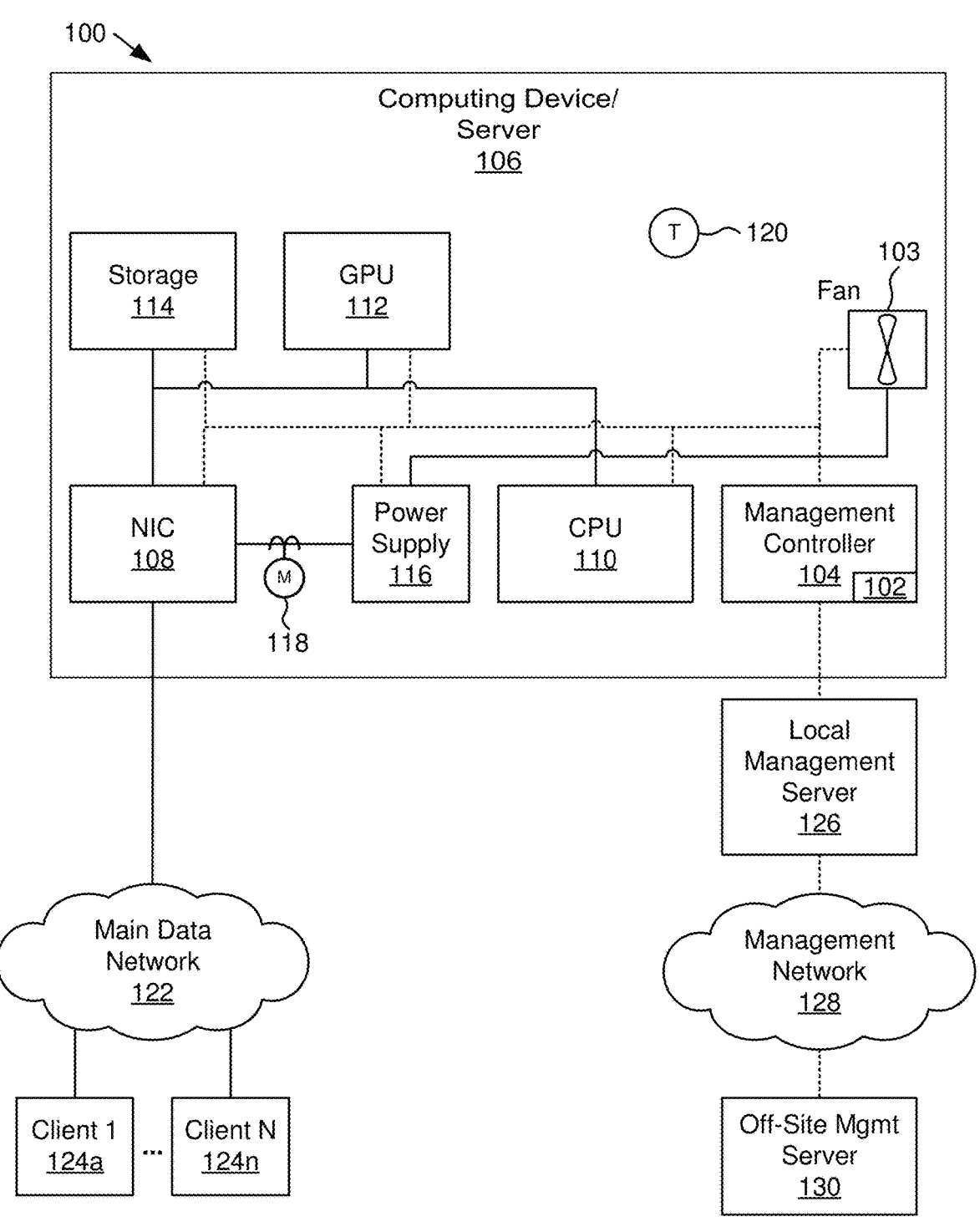
FIG. 1 is a schematic block diagram illustrating a system for adjusting fan speed based on a cable connection, according to various embodiments.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices, in some embodiments, are tangible, non-transitory, and/or non-transmission.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

More specific examples (a non-exhaustive list) of the storage device would include the following: an electrical connection having one or more wires, a portable computer diskette, a hard disk, a random access memory ("RAM"), a read-only memory ("ROM"), an erasable programmable read-only memory ("EPROM" or Flash memory), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, R, Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C.

A method for adjusting fan speed based on a cable connection is disclosed. An apparatus and computer program product also perform the functions of the method. The method includes reading an identifier ("ID") of a network interface card ("NIC") installed in a computing device, the identifier indicating a NIC type, determining one or more cable types connectable to the NIC from the specification information of the NIC, and measuring power consumption of the NIC. The method includes determining from the power consumption the one or more cable types connectable to the NIC a current cable type connected to the NIC or a lack of a cable connected to the NIC, determining power requirements for the NIC based on the lack of a cable connected to the NIC or the current cable type connected to the NIC, and adjusting a fan speed of one or more fans of the computing device in response to determining the power requirements for the NIC.

In some embodiments, determining the power requirements for the NIC uses a data structure. The data structure includes a correlation of the power consumption of the NIC and the one or more cable types connectable to the NIC. In other embodiments, the method includes measuring a temperature related to the computing device where determining the current cable type connected to the NIC or the lack of a cable connected to the NIC includes using the power consumption of the NIC, the one or more cable types connectable to the NIC, and the measured temperature related to the computing device. In other embodiments, the measured temperature is an ambient temperature of a space comprising the computing device. In other embodiments, the measured temperature is measured within the computing device.

In some embodiments, the method includes repeating, at a prescribed interval, measuring the power consumption of the NIC, determining the current cable type connected to the NIC or the lack of a cable connected to the NIC based on a current power consumption of the NIC and the one or more cable types connectable to the NIC, determining the power requirements for the NIC, and adjusting the fan speed of the one or more fans. In other embodiments, determining the current cable type connected to the NIC or the lack of a cable connected to the NIC based on the power consumption of the NIC and the one or more cable types connectable to the NIC is in response to the measured power consumption of the NIC crossing a cable power threshold. In other embodiments, the method includes measuring a temperature related to the computing device and determining a current cable type connected to the NIC or a lack of a cable connected to the NIC includes using the power consumption of the NIC, the one or more cable types connectable to the NIC, and a measured temperature related to the computing device, and the method includes measuring the temperature at a same prescribed interval as measuring the power consumption of the NIC.

In some embodiments, the ID of the NIC is a physical security identifier ("PSID"). In other embodiments, the one or more cable types include a passive copper cable, an active copper cable, and/or a fiber optic cable. In other embodiments, measuring power consumption of the NIC is measured on the NIC or at a power riser feeding the NIC.

An apparatus for adjusting fan speed of a computing device based on connected cables includes a processor and non-transitory computer readable storage media storing code. The code is executable by the processor to perform operations that include reading an ID of a NIC installed in a computing device, where the ID indicates a NIC type, determining, based on the ID of the NIC, one or more cable types connectable to the NIC from specification information for the type of NIC and measuring power consumption of the NIC. The operations include determining from the power consumption of the NIC and the one or more cable types connectable to the NIC a current cable type connected to the NIC or a lack of a cable connected to the NIC. The operations include determining power requirements for the NIC based on the lack of a cable connected to the NIC or the current cable connect to the NIC and adjusting a fan speed of one or more fans of the computing device in response to determining the power requirements for the NIC.

In some embodiments, determining the power requirements for the NIC uses a data structure, the data structure comprising a correlation of the power consumption of the NIC and the one or more cable types connectable to the NIC. In other embodiments, the operations include measuring a temperature related to the computing device. Determining the current cable type connected to the NIC or the lack of a cable connected to the NIC includes using the power consumption of the NIC, the one or more cable types connectable to the NIC, and the measured temperature related to the computing device. In other embodiments, the measured temperature is an ambient temperature of a space that includes the computing device. In other embodiments, the measured temperature is measured within the computing device.

In some embodiments, the operations include repeating, at a prescribed interval, measuring the power consumption of the NIC, determining the current cable type connected to the NIC or the lack of a cable connected to the NIC based on a current power consumption of the NIC and the one or more cable types connectable to the NIC, determining the power requirements for the NIC, and adjusting the fan speed of the one or more fans. In other embodiments, determining the current cable type connected to the NIC or the lack of a cable connected to the NIC based on the power consumption of the NIC and the one or more cable types connectable to the NIC is in response to the measured power consumption of the NIC crossing a cable power threshold. In other embodiments, the operations include measuring a temperature related to the computing device and determining a current cable type connected to the NIC or a lack of a cable connected to the NIC includes using the power consumption of the NIC, the one or more cable types connectable to the NIC, and a measured temperature related to the computing device, and further comprising measuring the temperature at a same prescribed interval as measuring the power consumption of the NIC.

A program product for adjusting fan speed of a computing device based on connected cables includes a non-transitory computer readable storage medium storing code. The code is configured to be executable by a processor to perform operations. The operations include reading an ID of a NIC installed in a computing device, where the ID indicates a NIC type, determining, based on the ID of the NIC, one or more cable types connectable to the NIC from specification information for the type of NIC, and measuring power consumption of the NIC. The operations include determining from the power consumption of the NIC and the one or more cable types connectable to the NIC a current cable type connected to the NIC or a lack of a cable connected to the NCI. The operations include determining power requirements for the NIC based on the lack of a cable connected to the NIC or the current cable type connected to the NCI and adjusting a fan speed of one or more fans of a computing device in response to determining the power requirements for the NIC.

FIG. 1 is a schematic block diagram illustrating a system 100 for adjusting fan speed of one or more fans 103 of a computing device 106, according to various embodiments. The system 100 includes a computing device 106, a main data network 122 and clients 124a-124n, a local management server 126, a management network 128, and an off-site management server 130. The computing device 106, which may be a server, in various embodiments includes a cable connection apparatus 102 in a management controller 104, one or more fans 103, a network interface card ("NIC") 108, a central processing unit ("CPU") 110, a graphics processing unit ("GPU") 112, non-volatile data storage 114, a power supply 116, a power meter 118, and a temperature sensor 120, which are described below. As used herein, a computing device 106 and a server 106 are used interchangeably.

In some embodiments, the computing device 106 includes a management controller 104, which includes a cable connection apparatus 102. The cable connection apparatus 102, in some embodiments, is a monitoring and control system used to gather information about the cables connected to the computing device 106. The cable connection apparatus 102, in some embodiments, reads an identifier ("ID") of a NIC 108 installed in the computing device 106 to determine the NIC type. Various NICs have different characteristics and accommodate different cable types. The cable connection apparatus 102 determines, based on the ID of the NIC 108, one or more cable types connectable to the NIC 108 from specification information for the type of NIC 108 and measures power consumption of the NIC 108, for example, using the power meter 118.

The cable connection apparatus 102 determines from the power consumption of the NIC 108 and the one or more cable types connectable to the NIC 108 a current cable type connected to the NIC 108 or a lack of a cable currently connected to the NIC 108. The cable connection apparatus 102 determines power requirements for the NIC 108 based on the lack of a cable connected to the NIC 108 or the current cable type connected to the NIC 108 and then adjusts a fan speed of one or more fans 103 of the computing device 106 in response to determining the power requirements for the NIC 108. The cable connection apparatus 102, in various embodiments, runs metrics, gathers data, reads metering hardware, and reports a fan speed to the management controller 104, which adjusts fan speed. In some embodiments, the cable connection apparatus 102 interfaces with hardware of the computing device 106 and/or the management controller 104.

The computing device 106, in some embodiments, includes a management controller 104 configured to manage and access various components of the computing device 106 via a management network 126. The management controller 104, in some embodiments, is referred to as a baseboard management controller ("BMC"). In other embodiments, the management controller 104 is an Xclarity® Controller ("XCC") by Lenovo®, an Intel® AMT (Active Management Technology), or a controller with similar functionality. In some embodiments, the management controller 104 monitors internal physical variables in the computing device 106, GPUs 112, CPUs 110, non-volatile data storage 114, the NIC 108, the power supply 116, and other hardware devices, such as temperature, humidity, power supply voltage, fan speeds, communication parameters, operating system ("OS") functions, and the like and communicates metrics and other data to the local management server 126. In some embodiments, the management controller 104 measures and stores power consumption data, utilization data, operational data and other metering data of the computing device 106.

Typically a computing device 106 includes one or more CPUs 110. The CPU 110 typically processes code and data of one or more applications. In some embodiments, the computing device 106 hosts virtual machines ("VMs") running applications on behalf of clients 124a-124n connected to the computing device 106 over the main data network 122. The CPU 110, in some embodiments, includes multiple cores. In other embodiments, the computing device 106 includes multiple CPUs 110. In some embodiments, the computing device 106 includes one or more GPUs 112, which may be used to execute code of applications on VMs or other applications. Often GPUs 112 are used for parallel processing. In other embodiments, the computing device includes other processors, such as accelerators, which may also be used to service applications.

In some embodiments, the computing device 106 includes non-volatile data storage 114. The non-volatile data storage 114 may be in the form of solid-state storage, a hard disk drive ("HDD"), or the like. In some embodiments, the computing device 106 accesses non-volatile data storage located external to the computing device (not shown), such as non-volatile data storage on a storage area network ("SAN") (not shown). In some embodiments, the computing device 106 includes both internal non-volatile data storage 114 and access to external non-volatile data storage.

The computing device 106 includes one or more NICs 108 used to connect the CPU 110 and other hardware to the main data network 122. In some embodiments, a NIC 108 of a computing device 106 includes jacks to connect one or more cables of various types. Possible cable types include passive copper cables, active copper cables, and fiber optic cables. In some embodiments, the NIC 108 includes other cable types. A passive copper cable includes a connector at each end and copper cabling between the connectors. In some embodiments, the passive copper cables include one or more twisted pairs of copper wire. In some embodiments, the passive copper cables include two or more twisted shielded pairs of copper wire where each copper wire includes insulation and a pair of copper wires are twisted and shielded from each other by an insulation. Traditionally, passive copper cables are configured for different cable categories, such as category ("Cat") 3, Cat5, Cat5e, Cat6, and Cat6a, which support different network data rates. In some embodiments, the passive cable is a coaxial cable, which includes a center copper wire surrounded by insulation and then another copper mesh that is surrounded by additional insulation.

As networking speeds have increased, other cable types are now in use, such as active copper cables, which may also be called active cables. Active copper cables typically include integrated circuits embedded in the cable at one or both ends of the cable that compensate for data degradation from impairments, such as attenuation, crosstalk, and group velocity distortion. Active copper cables typically allow higher data rates than passive copper cables but draw more power from NICs 108 to which they are connected. Fiber optic cables may also be connected to the NIC 108. Fiber optic cables also typically include integrated circuits, for example, a transceiver, connected at the ends of the fiber optic cable. As will active copper cables, fiber optic cables are typically capable of higher data rates than passive copper cables, but also draw more power from a connected NIC 108 than passive copper cables. Typically, various cable types connected to the NICs 108 draw different amounts of power.

In some embodiments, system 100 includes computing devices 106 in the form of servers 106 arranged in a racks. In other embodiments, the servers 106 are blade servers. In other embodiments, the computing device 106 is a desktop computer, a workstation, a mainframe computer, or the like. In some embodiments, system 100 is a datacenter including multiple server arrangements and dozens of servers 106 arranged in racks. In other embodiments, system 100 is an edge computing center including fewer computing devices 106 than a data center. In some embodiments, the computing device 106 does not include a management controller 104 and the cable connection apparatus 102 is located within the computing device 106 and has access to the NIC 108, the CPU 110, etc.

The computing device 106 includes one or more fans 103 configured to provide cooling to the computing device 106 by moving air through the computing device 106. In some embodiments where the computing device 106 is a server 106 in a rack, the one or more fans 103 may be located at a front edge of a server 106 and push air towards a back of the server 106. Other computing devices 106 and servers 106 include fans 103 in other configurations. In other embodiments, one of the one or more fans 103 is located to provide cooling to the CPU 110. Rather than setting the fan speeds to a worst case based on a highest power cable connected to the NIC 108, the cable connection apparatus 102 is able to identify which jacks of the NIC 108 include cables and which jacks do not have cables attached and an amount of power drawn by the connected cables, which allows the cable connection apparatus 102 to adjust a fan speed of the one or more fans 103 based on the actual power draw of the cables.

In some embodiments, temperature sensor 120 is located within the computing device 106. In some embodiments, a temperature sensor (not shown) is located in a space housing multiple servers 106 to report the temperature of a grouping of servers 106. In some examples, the temperature sensor 120 is located on a server rack to measure the temperature of a servers 106 in the rack. In other embodiments, the temperature sensor 120 is located outside of server 106 to measure an ambient temperature of system 100. The temperature sensor 120 may be a thermostat, a thermocouple, or other temperature sensor capable of measuring and reporting a temperature.

In some embodiments, the computing device 106 includes a power supply 116 which is configured to provide power to the NIC 108 and other hardware components of the computing device 106. In other embodiments, the power supply 116 is located in a rack external to the computing device 106. The power supply 116 typically converts alternating current ("AC") power to direct current ("DC") power at one or more DC voltages for use by various components of the computing device 106.

In some embodiments, a power riser from the power supply 116 to the NIC 108 is metered by a power meter 118, as depicted in FIG. 1. In some embodiments, the power meter 118 measures current to the NIC 108 and voltage of the power riser to the NIC 108 and power usage by the NIC 108 is calculated by the power meter 118 or elsewhere. In other embodiments, the NIC 108 includes internal power monitoring reported to the cable connection apparatus 102 through the management controller 104. In some embodiments, the meter 118 measures the current from the power supply 116 and uses a nominal voltage of the power riser to the NIC 108 to calculate power used by the NIC 108. In alternative embodiments, the meter 118 measures both the current and the voltage from the power supply 116, the measured current and voltage are used to calculate power usage of the NIC 108.

Typically, a NIC 108 has a set baseline power consumption and different NIC 108 types have differing baseline power consumptions. When a cable is connected to the NIC 108, typically power consumption of the NIC 108 increases. Typically, the baseline power consumption with no cable attached, power consumption with a passive copper cable attached, power consumption of the NIC 108 with an active copper cable attached, and power consumption of the NIC 108 with a fiber optic cable attached all have different power values, which may be used to identify whether a cable is attached to the NIC 108 and which type of cable is attached.

Power consumption profiles of various NIC types may be stored in various data structures and databases.

The NIC 108 typically includes an identifier and the cable connection apparatus 102 is typically able to read the identifier of the NIC 108 to determine a type for the NIC 108. In some embodiments, the identifier is a physical security identifier ("PSID"). In other embodiments, the identifier for the NIC 108 is a product identifier ("PID") or a combination of a vendor identifier ("VID") and a PID. In other embodiments, the identifier for the NIC 108 is a hardware identifier ("HWID"). In other embodiments, the identifier for the NIC 108 is a media access control ("MAC") address. In other embodiments, the identifier for the NIC 108 is a serial number. Typically, the identifier for the NIC 108 is assigned by the manufacturer of the NIC 108 and is correlated with the particular NIC type or model of the NIC 108. Each NIC type or model of NIC 108 has a unique baseline power usage and each type or model of NIC 108 draws a different amount of power for various connected cable types.

The computing device 106 is depicted as connected to a management network 128 and a main data network 122. Typically, the management network 128 is separate from the main data network 122 and provides a channel for managing the computing device 106. In some embodiments, a system administrator is able to access the computing device 106 via an off-site management server 130, which is connected to the management controller 104 through the local management server 126. In other embodiments, the management network 126 is connected to the NIC 108 and is a secure channel running on the main data network 122, such as over a virtual private network ("VPN"). Where the computing device 106 includes a management controller 104, a system administrator, the local management server 126, and/or the off-site management server 130 are able to manage deployment operations, control fan speed, monitor operations of the computing equipment, and the like.

While the main data network 122 is connected to a cable of some type, portions of the main data network 122 may include a LAN, a WAN, a fiber network, a wireless connection, and the like, and may include more than one type of network. The wireless connection may be a mobile telephone network. The wireless connection may also employ a Wi-Fi network based on any one of the Institute of Electrical and Electronics Engineers ("IEEE") 802.11 standards. Alternatively, the wireless connection may be a BLUETOOTH® connection. In addition, the wireless connection may employ a Radio Frequency Identification ("RFID") communication including RFID standards established by the International Organization for Standardization ("ISO"), the International Electrotechnical Commission ("IEC"), the American Society for Testing and Materials® ("ASTM"®), the DASH7™ Alliance, and EPCGlobal™.

Alternatively, the wireless connection may employ a ZigBee® connection based on the IEEE 802 standard. In one embodiment, the wireless connection employs a Z-Wave® connection as designed by Sigma Designs®. Alternatively, the wireless connection may employ an ANT® and/or ANT+® connection as defined by Dynastream® Innovations Inc. of Cochrane, Canada.

The wireless connection may be an infrared connection including connections conforming at least to the Infrared Physical Layer Specification ("IrPHY") as defined by the Infrared Data Association® ("IrDA"®). Alternatively, the wireless connection may be a cellular telephone network communication. All standards and/or connection types include the latest version and revision of the standard and/or connection type as of the filing date of this application.

Figure 2:
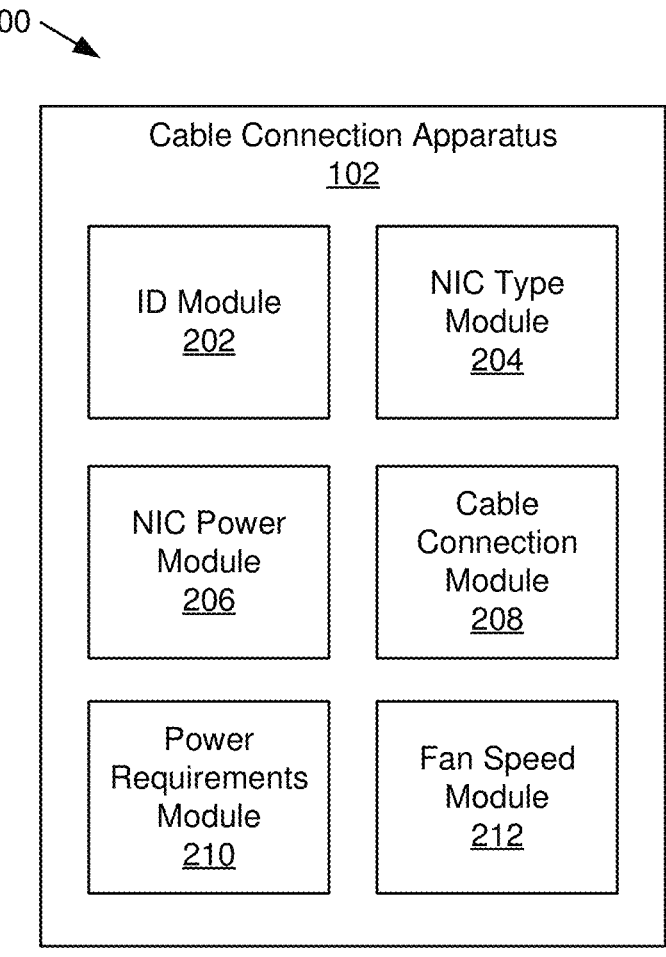
FIG. 2 is a schematic block diagram illustrating an apparatus for adjusting fan speed based on a cable connection, according to various embodiments.

FIG. 2 is a schematic block diagram illustrating an apparatus 200 for adjusting fan speed based on a cable connection, according to various embodiments. The apparatus 200 includes a cable connection apparatus 102 that includes an ID module 202, a NIC type module 204, a NIC power module 206, a cable connection module 208, a power requirements module 210, and a fan speed module 212, which are described below. In some embodiments, the apparatus 200 is implemented with code that is executable by a processor and the code is stored on computer readable storage media, which is non-transitory. In other embodiments, all or a portion of the apparatus 102 is implemented using hardware circuits and/or a programmable hardware device.

The apparatus 200 includes an ID module 202 configured to read an ID of a NIC 108 installed in the computing device 106. The ID indicates a NIC type, such as a manufacturer and model of the NIC 108. The ID module 202, in various embodiments, reads a PSID of the NIC 108. In other embodiments, the ID module 202 reads a MAC address, a HWID, a PID, a VID, a serial number, or the like that is unique to the NIC 108. In some embodiments, the ID module 202 reads the ID of the NIC 108 over an internal management network 128 of the computing device 106. In other embodiments, the ID module 202 uses another communication bus to read the ID of the NIC 108. Where the computing device 106 includes two or more NICs 108, the ID module 202 reads the ID for each NIC 108 of the computing device 106.

The apparatus 200 includes a NIC type module 204 configured to determine, based on the ID of the NIC 108, one or more cable types connectable to the NIC 108 from specification information for the type of NIC 108. In some embodiments, the NIC type module 204 accesses information correlating the ID of the NIC 108 with a NIC type, which is then correlated with cable types that are connectable to the NIC 108. In some embodiments, the cable connection apparatus 102 includes a table or other data structure that correlates the ID of the NIC 108 with the NIC type and/or cable types that are connectable to the NIC 108, and the NIC type module 204 accesses the table or data structure in the computing device 106. In other embodiments, the NIC type module 204 accesses a database, table, etc. within the computing device 106 to find the cable type information for the NIC 108 and/or NIC type from the ID of the NIC 108. In other embodiments, the NIC type module 204 accesses information correlating the ID of the NIC 108 with the cable type information for the NIC 108 and/or NIC type via a manufacturer website or other external website. One of skill in the art will recognize other ways for the NIC type module 204 to identify one or more cable types connectable to the NIC 108 and/or the NIC type from the ID of the NIC 108.

The apparatus 200 includes a NIC power module 206 configured to measure power consumption of the NIC 108. In some embodiments, the NIC power module 206 is connected to the power meter 118 and reads power consumption of the NIC 108. In other embodiments, the NIC 108 has internal metering to measure incoming power and the NIC power module 206 accesses the NIC 108 to read power usage of the NIC 108. In some embodiments, the NIC power module 206 reads current and voltage, for example using the power meter 118 or separate current and voltage meters and then calculates power consumption of the NIC 108.

In some embodiments, the NIC power module 206 measures instantaneous power consumption of the NIC 108. In other embodiments, the NIC power module 206 reads power consumption of the NIC 108 over a period of time and averages the power consumption of the NIC 108 to determine the power consumption of the NIC 108. In other embodiments, the NIC power module 206 periodically measures power consumption of the NIC 108, which may trigger changes in fan speed when power consumption of the NIC 108 changes. One of skill in the art will recognize other ways for the NIC power module 206 to measure power consumption of the NIC 108.

The apparatus 200 includes a cable connection module 208 configured to determine from the power consumption of the NIC 108 and the one or more cable types connectable to the NIC 108, a current cable type connected to the NIC 108 or a lack of a cable connected to the NIC 108. In some embodiments, for each NIC type, there is at least one data structure which includes the power measured across the NIC for no cable connected to the NIC 108 and for the one or more cable types connectable to the NIC 108.

Figure 4:
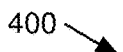
FIG. 4 is a table illustrating different NICs and corresponding NIC power usage for each cable connection type, according to various embodiments.

FIG. 4 is a table 400 illustrating different NICs 108 and corresponding NIC power usage for each cable connection type, according to various embodiments. For example, NIC A uses 5 watts ("W") with no cable attached, 8 W with a passive copper cable attached, and 13 W with an active copper cable attached. NIC B uses 10 W with no cable attached, 15 W with a passive copper cable attached, and 20 W with an active copper cable attached. Power usage for NIC C and NIC D are also depicted. Where the ID module 202 and the NIC type module 204 have identified an ID for the NIC 108 that correlates to NIC B, the table 400 of FIG. 4 indicates that NIC type B can have no cable, a passive copper cable, and an active copper cable, and the NIC power module 206 measures 10 W, the cable connection module 208 determines from a data structure corresponding to FIG. 4 that a passive cable is attached to the NIC 108.

While the table 400 of FIG. 4 indicates discrete power values for each column, in other embodiments, each cable type (including no cable attached) corresponds to a power range. For example, NIC type A may have a power range for no cable attached from 3.5 W to 6.5 W, a power range for a passive cable of 6.5 W to 10.5 W, and for an active copper cable of 10.5 W to 15.5 W. Thus, if the NIC power module 206 measures 12 W, the cable connection module 208 determines that an active cable is attached to the NIC 108. In some embodiments, the data structure used to identify from the ID of the NIC 108 the NIC type and/or the one or more cables connectable to the NIC 108, also includes power usages for no connected cable and for the various cables connectable to the NIC 108. The cable connection module 208, in some embodiments, uses this data structure to determine which cable type is connected to the NIC 108 or that no cable is connected to the NIC 108.

While the examples included herein include determining if a single cable is attached to the NIC 108, the embodiments described herein are not so limited. The table 400 of FIG. 4 may be expanded to include a more complex data structure for a NIC 108 where more than one cable can be attached to the NIC 108. In the embodiments, a table or other data structure similar to the table 400 of FIG. 4 may include power consumption levels for the NIC 108 with no cables attached, one passive cable attached, or an active cable attached to port 1 and no cables attached, one passive cable attached, or an active cable attached to port 2, etc.

The apparatus 200 includes a power requirements module 210 configured to determine power requirements for the NIC 108 based on the lack of a cable connected to the NIC 108 or the current cable type connected to the NIC 108. In some embodiments, the power requirements module 210 uses the power measured by the NIC power module 206 plus an amount of power determined to be a worst case power usage for the NIC 108 for the particular cable that is attached to the NIC 108. For example, if the NIC power module 206 measures 8 W for a passive cable for NIC type A, the power requirements module 210 may add 2 W to the measured 8 W so that the determined power requirements for the NIC 108 are 10 W. In other embodiments, the power requirements module 210 consults a data structure that includes a maximum power for each type of connected cable to determine the power requirements for the NIC 108.

In other embodiments, the power requirements module 210 uses an upper limit of a range associated with a cable connected to the NIC 108. For example, where the NIC type is A and the cable connection module 208 determines that a passive cable is attached to the NIC 108, the power requirements module 210 determines that the power requirements for the NIC 108 are 10.5 W, as indicated in the example above. In some embodiments, the power requirements module 210 uses a power requirement for the NIC 108 lower than a maximum power requirement for the connected cable to the NIC 108, such as a nominal power or the measured power for the particular cable type that is attached or for no cable attached. One of skill in the art will recognize other ways for the power requirements module 210 to determine the power requirements for the NIC 108 based on the current cable type or lack of a connected cable.

The apparatus 200 includes fan speed module 212 configured to adjust a fan speed of one or more fans 103 of the computing device in response to determining the power requirements for the NIC 108. In some embodiments, the fan speed of the one or more fans 103 is based on an overall power consumption of the computing device 106 where power usage of the NIC 108 is a portion of the overall power consumption of the computing device 106. In some embodiments, the overall power consumption of the computing device 106 is used to set a particular fan speed of the one or more fans 103.

In some embodiments, the fan speed module 212 accesses a calculation of overall power consumption of the computing device 106 to adjust a current power requirements of the NIC 108 and based on an updated overall power consumption of the computing device 106, the fan speed module 212 adjusts the fan speed of the one or more fans 103. In other embodiments, the fan speed module 212 accesses a table with power consumption of various components of the computing device 106 and adjusts an entry in the table for the NIC 108 to update power requirements of the NIC 108. The fan speed module 212 then accesses a total power consumption for the computing device 106 to determine a proper fan speed of the one or more fans 103.

In some embodiments, the fan speed module 212 updates power usage of the NIC 108 and another component in the management controller 104 updates the total power consumption of the computing device 106 and/or changes the fan speed of the one or more fans 103. In other embodiments, the fan speed module 212 issues a fan speed command based on updating the total power consumption of the computing device 106 based on the power requirements of the NIC 108.

Figure 3:
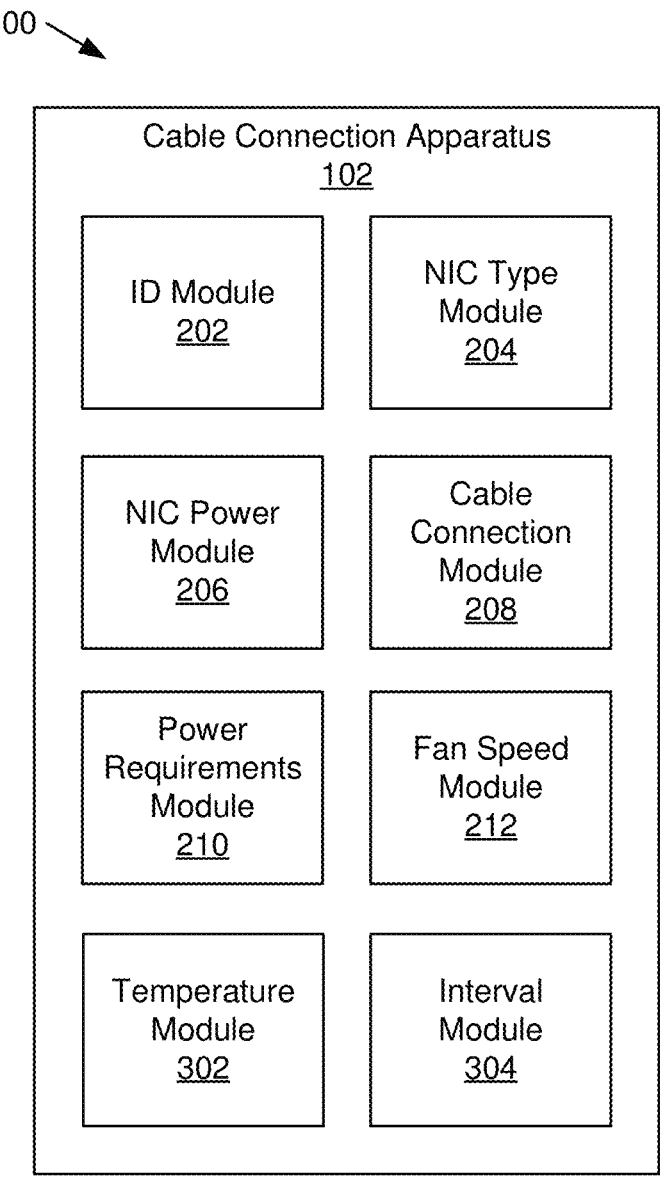
FIG. 3 is a schematic block diagram illustrating another apparatus for adjusting fan speed based on a cable connection, according to various embodiments.

FIG. 3 is a schematic block diagram illustrating another apparatus 300 for adjusting fan speed based on a cable connection, according to various embodiments. The apparatus 300 includes a cable connection apparatus 102 with an ID module 202, a NIC type module 204, a NIC power module 206, a cable connection module 208, a power requirements module 210, a fan speed module 212, which are substantially similar to those described above in relation to the apparatus 200 of FIG. 2. In various embodiments, the apparatus 300 includes a temperature module 302, and/or an interval module 304, which are described below. In some embodiments, the apparatus 300 is implemented similarly to the apparatus 200 of FIG. 2.

In some embodiments, the apparatus 300 includes a temperature module 302 configured to measure a temperature related to the computing device 106. Temperature may then be used in adjusting the fan speed. In some embodiments, temperature affects power consumption of the NIC 108. In some examples, a higher temperature will cause the NIC 108 to use more power than lower temperatures. In some embodiments, the temperature module 302 measures the temperature within the computing device 106, for example, using the temperature sensor 120. In the embodiments, the internal temperature of the computing device 106 is correlated with power usage of the NIC 108.

Figure 5:
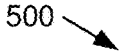
FIG. 5 is a table illustrating different NICs and corresponding NIC power usage for each cable connection type depending on temperature, according to various embodiments.

In other embodiments, the temperature module 302 measures an ambient temperature of a space that includes the computing device 106, such as a room where the computing device 106 is located. In other embodiments, the space that includes the computing device 106 includes a rack where the computing device 106 is mounted. In the embodiments, the temperature module 302 uses a temperature sensor 120 in the space there the computing device 106 is located. In the embodiments, power usage of the NIC 108 is correlated with the temperature of the space where the computing device 106 is located. As used herein, the temperature module 302 measuring a temperature related to the computing device 106 includes directly measuring a temperature, for example using the temperature sensor 120, as well as receiving a temperature from the temperature sensor 120, from the computing device 106, from a management network 128, from the management controller 104, or other device associated with the computing device. In some examples, the temperature sensor 120 is a thermocouple, a thermostat, etc.

Where the apparatus 300 includes a temperature module 302, the cable connection module 208 determines the current cable type connected to the NIC 108 or the lack of a cable connected to the NIC 108 based on a current power consumption of the NIC 108, the measured temperature, and the one or more cable types connectable to the NIC 108. FIG. 5 is a table 500 illustrating different NICs 108 and corresponding NIC power usage for each cable connection type depending on temperature, according to various embodiments. The table 500 of FIG. 5 in similar to the table 400 of FIG. 4 except that the table 500 of FIG. 5 divides power data for a type of NIC by temperature of above and below 27 degrees Celsius ("C").

While the table 500 of FIG. 5 include that for temperatures less than 27 C, power requirements for various cable or lack of a cable are less than for temperatures above 27 C, the embodiments described herein are not so limited and may use any table with entries for various NICs with different entries for different temperatures. The cable connection module 208, in some embodiments, accesses a table or other data structure similar to the table 500 of FIG. 5 with power and temperature information to determine a type of cable or lack of cable connected to the NIC 108. In an example, where the NIC type is A and the temperature is less than 27 C and the measured power is 8 W, the cable connection module 208 determines that the connected cable is a passive cable. In another example, where the NIC type is D, the temperature is greater than or equal to 27 C and the measured power is 8 W, the cable connection module 208 determines that the connected cable is a passive cable.

While the table 500 of FIG. 5 includes two categories for temperature, other embodiments include more than two categories for temperature. In some examples, the NIC 108 may be configured for two cables connected to the NIC 108 at the same time. In the examples, a table or data structure similar to the table 500 of FIG. 5 may be used that includes temperature may also include information for more than a cable being attached and the cable connection module 208 uses measured power for the NIC 108 and temperature related to the computing device 106 to determine cable types or lack of cable connected to two or more jacks of the NIC 108.

In some embodiments, the apparatus 300 includes an interval module 304 configured to determine the appropriate time interval to reevaluate the fan speed of the one or more fans 103 based on the power consumption of the NIC 108. In some embodiments, the interval module 304 triggers, at a chosen interval, the NIC power module 206 to measure the NIC power consumption of the NIC 108, and optionally the temperature module 302 to measure a temperature related to the computing device 106. In some embodiments, the interval module 304 triggers the cable connection module 208 to determine the current cable type connected to the NIC 108 or the lack of a cable connected to the NIC 108 based on a current power consumption of the NIC 108 and the one or more cable types connectible to the NIC 108. Where temperature is also used, the interval module 304 triggers the cable connection module 208 to determine the current cable type connected to the NIC 108 or the lack of a cable connected to the NIC 108 based on a current power consumption of the NIC 108, the measured temperature, and the one or more cable types connectable to the NIC 108. In response to the cable connection module determining the cable type or lack of cable connected to the NIC 108, the interval module 304 triggers that power requirements module 210 to determine the power requirements for the NIC 108 and the fan speed module 212 to adjust the fan speed of the one or more fans 103.

In other embodiments, the interval module 304 reevaluates the fan speed of the one or more fans 103 when the temperature module 302 detects a temperature change by temperature sensor 120, for example when crossing a temperature threshold. In other embodiments, the interval module 304 reevaluates the fan speed at a chosen time, such as a particular hour of a day, a particular minute in each hour, etc. One of skill in the art will recognize other appropriate intervals and triggers for the interval module 304.

Figure 6:
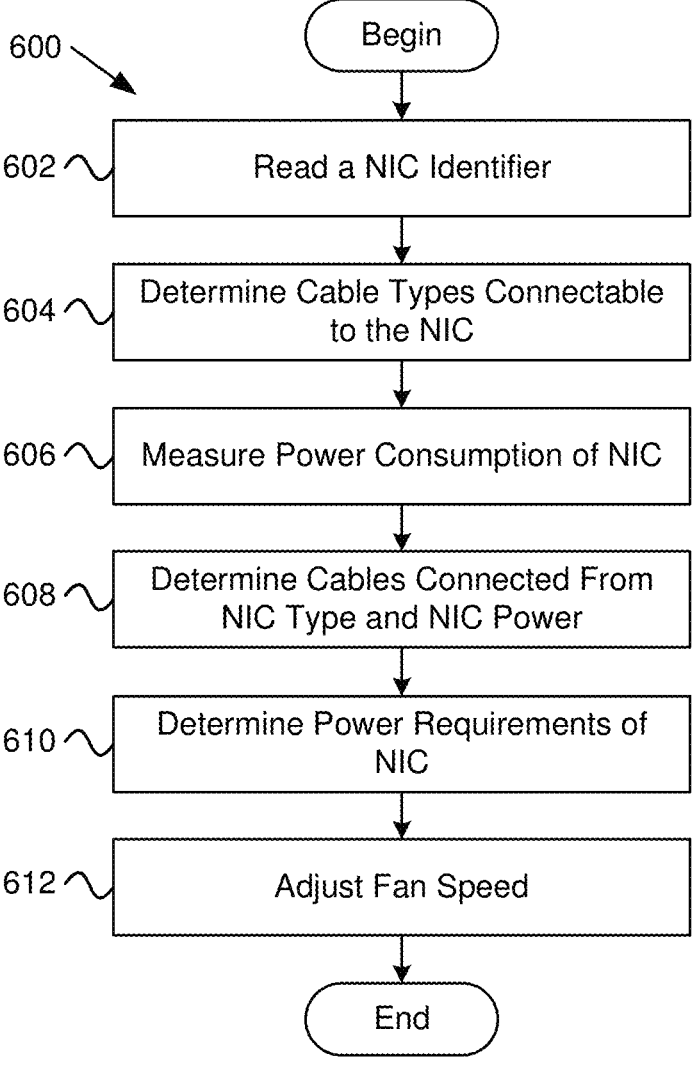
FIG. 6 is a schematic flow chart diagram illustrating a method for adjusting the fan speed in a cable connection system, according to various embodiments.

FIG. 6 is a schematic flow chart diagram illustrating a method 600 for adjusting the fan speed in a cable connection system, according to various embodiments. The method 600 begins and reads 602 a NIC identifier of a NIC 108 installed in a computing device 106. The ID indicates a NIC type. The method 600 determines 604, based on the ID of the NIC 108, one or more cable types connectable to the NIC 108 from specification information for the type of NIC 108 and measures 606 power consumption of the NIC 108. The method 600 determines 608 from the power consumption of the NIC 108 and the one or more cable types connectable to the NIC 108, a current cable type connected to the NIC 108 or a lack of a cable connected to the NIC 108. The method 600 determines 610 power requirements for the NIC 108 based on the lack of a cable connected to the NIC 108 or the current cable type connected to the NIC 108 and adjusts 612 a fan speed of one or more fans 103 of the computing device 106 in response to determining the power requirements for the NIC 108, and the method 600 ends. In various embodiments, all or a portion of the method 600 is implemented using the ID module 202, the NIC type module 204, the NIC power module 206, the cable connection module 208, the power requirements module 210, and the fan speed module 212.

Figure 7:
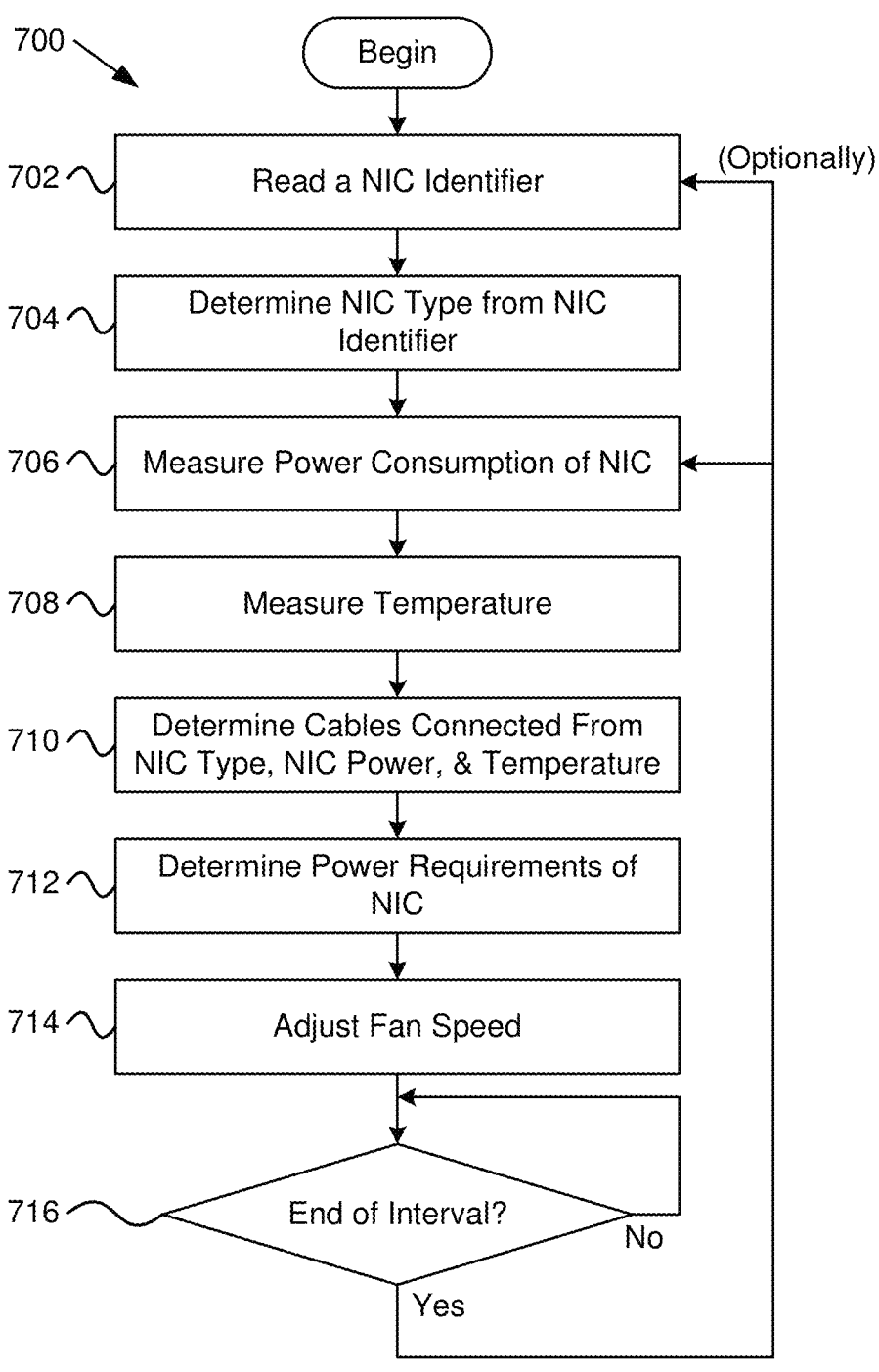
FIG. 7 is a schematic flow chart diagram illustrating a method for adjusting the fan speed in a cable connection system, according to various embodiments.

FIG. 7 is a schematic flow chart diagram illustrating another method 700 for adjusting the fan speed based on cable connections, according to various embodiments. The method 700 begins and reads 702 a NIC identifier of a NIC 108 installed in a computing device 106. The ID indicates a NIC type. The method 700 determines 704, based on the ID of the NIC 108, one or more cable types connectable to the NIC 108 from specification information for the type of NIC 108 and measures 706 power consumption of the NIC 108 and measures 708 temperature related to the computing device 106 and determines 710 from the power consumption of the NIC 108, the measured temperature, and the one or more cable types connectable to the NIC 108, a current cable type connected to the NIC 108 or a lack of a cable connected to the NIC 108.

The method 700 determines 712 power requirements for the NIC 108 based on the lack of a cable connected to the NIC 108 or the current cable type connected to the NIC 108 and adjusts 714 a fan speed of one or more fans 103 of the computing device 106 and determines 716 if an end of an interval has been reached. If the method 700 determines 716 that the end of the interval has not been reached, the method 700 returns and again determines 716 if the end of the interval has been reached. If the method 700 determines 716 that the end of the interval has been reached, the method 700 returns and measures 706 power consumption of the NIC and measures a temperature related to the computing device 106. Optionally, the method 700 re-reads 702 the NIC identifier, for example, to determine if a new NIC 108 has been attached, and determines 704 one or more cable types connectable to the NIC 108. In various embodiments, all or a portion of the method 700 is implemented using the ID module 202, the NIC type module 204, the NIC power module 206, the cable connection module 208, the power requirements module 210, the fan speed module 212, the temperature module 302, and/or the interval module 304.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
    reading an identifier ("ID") of a network interface card ("NIC") installed in a computing device, the ID indicating a NIC type;
    determining, based on the ID of the NIC, one or more cable types connectable to the NIC from specification information for the type of NIC;
    measuring power consumption of the NIC;
    determining from the power consumption of the NIC and the one or more cable types connectable to the NIC one of:
        a current cable type connected to the NIC; and
        a lack of a cable connected to the NIC;
    determining power requirements for the NIC based on the lack of a cable connected to the NIC or the current cable type connected to the NIC; and adjusting a fan speed of one or more fans of the computing device in response to determining the power requirements for the NIC.

2. The method of claim 1, wherein determining the power requirements for the NIC uses a data structure, the data structure comprising a correlation of the power consumption of the NIC and the one or more cable types connectable to the NIC.

3. The method of claim 1, further comprising measuring a temperature related to the computing device, wherein determining one of a current cable type connected to the NIC and a lack of a cable connected to the NIC comprises using the power consumption of the NIC, the one or more cable types connectable to the NIC, and the measured temperature related to the computing device.

4. The method of claim 3, wherein the measured temperature is an ambient temperature of a space comprising the computing device.

5. The method of claim 3, wherein the measured temperature is measured within the computing device.

6. The method of claim 1, further comprising repeating at a prescribed interval:
    measuring the power consumption of the NIC;
    determining the current cable type connected to the NIC or the lack of a cable connected to the NIC based on a current power consumption of the NIC and the one or more cable types connectable to the NIC;
    determining the power requirements for the NIC; and
    adjusting the fan speed of the one or more fans.

7. The method of claim 6, wherein determining the current cable type connected to the NIC or the lack of a cable connected to the NIC based on the power consumption of the NIC and the one or more cable types connectable to the NIC is in response to the measured power consumption of the NIC crossing a cable power threshold.

8. The method of claim 6, further comprising measuring a temperature related to the computing device and wherein determining one of the current cable type connected to the NIC and the lack of a cable connected to the NIC comprises using the power consumption of the NIC, the one or more cable types connectable to the NIC, and a measured temperature related to the computing device, and further comprising measuring the temperature at a same prescribed interval as measuring the power consumption of the NIC.

9. The method of claim 1, wherein the ID of the NIC is a physical security identifier ("PSID").

10. The method of claim 1, wherein the one or more cable types comprise a passive copper cable, an active copper cable, and/or a fiber optic cable.

11. The method of claim 1, wherein measuring power consumption of the NIC is measured one of:
    on the NIC; and
    at a power riser feeding the NIC.

12. An apparatus, comprising:
    a processor; and
    non-transitory computer readable storage media storing code, the code being executable by the processor to perform operations comprising:
        reading an identifier ("ID") of a network interface card ("NIC") installed in a computing device, the ID indicating a NIC type;
        determining, based on the ID of the NIC, one or more cable types connectable to the NIC from specification information for the type of NIC;
        measuring power consumption of the NIC;

determining from the power consumption of the NIC and the one or more cable types connectable to the NIC one of:

a current cable type connected to the NIC; and a lack of a cable connected to the NIC;

determining power requirements for the NIC based on the lack of a cable connected to the NIC or the current cable type connected to the NIC; and adjusting a fan speed of one or more fans of the computing device in response to determining the power requirements for the NIC.

13. The apparatus of claim 12, wherein determining the power requirements for the NIC uses a data structure, the data structure comprising a correlation of the power consumption of the NIC and the one or more cable types connectable to the NIC.

14. The apparatus of claim 12, further comprising operations comprising measuring a temperature related to the computing device, wherein determining one of the current cable type connected to the NIC and the lack of a cable connected to the NIC comprises using the power consumption of the NIC, the one or more cable types connectable to the NIC, and the measured temperature related to the computing device.

15. The apparatus of claim 14, wherein the measured temperature is an ambient temperature of a space comprising the computing device.

16. The apparatus of claim 14, wherein the measured temperature is measured within the computing device.

17. The apparatus of claim 12, further comprising repeating at a prescribed interval:

measuring the power consumption of the NIC;

determining the current cable type connected to the NIC or the lack of a cable connected to the NIC based on a current power consumption of the NIC and the one or more cable types connectable to the NIC;

determining the power requirements for the NIC; and adjusting the fan speed of the one or more fans.

18. The apparatus of claim 17, wherein determining the current cable type connected to the NIC or the lack of a cable connected to the NIC based on the power consumption of the NIC and the one or more cable types connectable to the NIC is in response to the measured power consumption of the NIC crossing a cable power threshold.

19. The apparatus of claim 17, further comprising measuring a temperature related to the computing device and wherein determining one of a current cable type connected to the NIC and a lack of a cable connected to the NIC comprises using the power consumption of the NIC, the one or more cable types connectable to the NIC, and a measured temperature related to the computing device, and further comprising measuring the temperature at a same prescribed interval as measuring the power consumption of the NIC.

20. A program product comprising a non-transitory computer readable storage medium storing code, the code being configured to be executable by a processor to perform operations comprising:

reading an identifier ("ID") of a network interface card ("NIC") installed in a computing device, the ID indicating a NIC type;

determining, based on the ID of the NIC, one or more cable types connectable to the NIC from specification information for the type of NIC;

measuring power consumption of the NIC;

determining from the power consumption of the NIC and the one or more cable types connectable to the NIC one of:

a current cable type connected to the NIC; and a lack of a cable connected to the NIC;

determining power requirements for the NIC based on the lack of a cable connected to the NIC or the current cable type connected to the NIC; and adjusting a fan speed of one or more fans of the computing device in response to determining the power requirements for the NIC.

* * * * *